(12) United States Patent
Mao et al.

(10) Patent No.: US 11,787,730 B2
(45) Date of Patent: Oct. 17, 2023

(54) GLASS POWDER AND SILVER PASTE COMPRISING SAME

(71) Applicant: NANTONG T-SUN NEW ENERGY CO., LTD., Nantong (CN)

(72) Inventors: Ping Mao, Nantong (CN); Xin Zhao, Nantong (CN); Jinhua Zheng, Nantong (CN)

(73) Assignee: NANTONG T-SUN NEW ENERGY CO., LTD., Nantong (CN)

(*) Notice: Subject to any disclaimer, the term of this patent is extended or adjusted under 35 U.S.C. 154(b) by 0 days.

(21) Appl. No.: 17/777,934

(22) PCT Filed: Nov. 30, 2020

(86) PCT No.: PCT/CN2020/132699
§ 371 (c)(1),
(2) Date: May 18, 2022

(87) PCT Pub. No.: WO2022/041537
PCT Pub. Date: Mar. 3, 2022

(65) Prior Publication Data
US 2023/0174412 A1 Jun. 8, 2023

(30) Foreign Application Priority Data
Aug. 26, 2020 (CN) .......................... 202010868973.2

(51) Int. Cl.
*H01B 1/22* (2006.01)
*C03C 4/14* (2006.01)
(Continued)

(52) U.S. Cl.
CPC ................ *C03C 4/14* (2013.01); *C03C 8/16* (2013.01); *C03C 8/18* (2013.01); *H01B 1/22* (2013.01);
(Continued)

(58) Field of Classification Search
CPC .... H01B 1/16; H01B 1/22; C09D 5/24; C03C 3/122; C03C 4/14; C03C 14/006
See application file for complete search history.

(56) References Cited

U.S. PATENT DOCUMENTS 4,945,071 A * 7/1990 Friesen .................... C03C 3/122
106/1.19
9,556,061 B2 * 1/2017 Naito ........................ C03C 8/24
(Continued)

OTHER PUBLICATIONS

English language translation of form PCT/ISA/237 dated May 26, 2021.*
(Continued)

*Primary Examiner* — Mark Kopec
(74) *Attorney, Agent, or Firm* — CBM PATENT CONSULTING, LLC

(57) ABSTRACT

A glass powder is a glass powder comprising vanadium-tellurium-silver, which has a softening temperature of 230-330° C. and a median particle size of 1-2 μm; when the glass powder is applied to the silver paste, the requirement that the silver paste is sintered at the temperature of 230-400° C. can be met, and a firm three-dimensional network structure can be formed in the glass system after the silver paste is sintered, and the welding tension of a front silver electrode can be improved; the addition of other metal elements to the glass powder can enable the network structure of the glass powder to be more compact and complete and ensure the stability of the glass powder; the prepared silver paste can be sintered at a temperature of 230-400° C.

8 Claims, 13 Drawing Sheets

(51) Int. Cl.
    *C03C 8/16* (2006.01)
    *C03C 8/18* (2006.01)
    *H01L 31/02* (2006.01)
    *H01L 31/0224* (2006.01)

(52) U.S. Cl.
    CPC .. *H01L 31/0201* (2013.01); *H01L 31/022425* (2013.01); *C03C 2204/00* (2013.01); *C03C 2205/00* (2013.01)

(56) References Cited

U.S. PATENT DOCUMENTS

| | | | |
|---|---|---|---|
| 9,950,948 B2* | 4/2018 | Naito | C03C 8/02 |
| 10,913,680 B2* | 2/2021 | Naito | C03C 8/02 |
| 2016/0304727 A1* | 10/2016 | Park | C03C 8/10 |
| 2022/0002188 A1* | 1/2022 | Choi | C03C 8/14 |

OTHER PUBLICATIONS

Dimitriev et al. "Glass structure of the $Ag_2O$—$TeO_2$—$V_2O_5$ system", Journal of Materials Science Letters 19, 2000, 1513-1516.*

* cited by examiner

GLASS POWDER AND SILVER PASTE COMPRISING SAME

TECHNICAL FIELD

The present invention relates to the technical field of conductive materials comprising metals or alloys, and particularly relates to a glass powder and a silver paste comprising the glass powder.

BACKGROUND

A tunnel oxide passivated contact (TOPCon) solar cell is a novel silicon solar cell proposed by the Fraunhofer Institute for Solar Energy Systems in Germany. The tunnel oxide passivated contact solar cell is made of an N-type silicon wafer, and has a structure sequentially comprising the following components from top to bottom: a front electrode, a front $SiN_x$ layer, an $Al_2O_3$ layer, a $P^+$ doped layer, an N-type silicon wafer, an $SiO_2$ tunneling oxide layer, an $N^+$ polycrystalline silicon layer, a back $SiN_x$ layer and a back electrode.

The patent CN201910354176.X entitled with "METALLIZATION METHOD FOR FRONT ELECTRODE OF N-TYPE SOLAR CELL" applied by the Nantong T-sun New Energy Co., Ltd. on Apr. 29, 2019 discloses a metallization method for a front electrode of an N-type solar cell, which comprises: printing an aluminum paste on an $SiN_x$ layer to form a first finger grid, overprinting a silver paste on the first finger grid to form a second finger grid, and finally printing a front silver paste on the first finger grid to form a busbar. The aluminum paste serving as the first finger grid has larger resistance, and is used on the front electrode to increase the line resistance of the finger grid and the front silicon wafer. The structure of the front electrode requires that the second finger grid silver paste overprinted on the first finger grid has low line resistance, has good silver-aluminum adhesion with the first finger grid aluminum paste and low silver-aluminum contact resistance, has thin grid lines as much as possible, and can be sintered at a lower temperature to reduce the damage to a silicon wafer; and that the front busbar silver paste printed on the first finger grid has properties such as high activity, superior welding tension, low line resistance, low sintering temperature and low compounding.

SUMMARY

In order to solve the above problems, the present invention provides a glass powder, a preparation method therefor and a silver paste comprising the glass powder, wherein the glass powder is a core material of a low-temperature sintered silver paste and has a softening point of 230-330° C., so that the silver paste comprising the glass powder is highly active in a lower-temperature environment, can be printed on a first finger grid to serve as a second finger grid paste or a busbar paste, and has the advantages such as low-temperature sintering, low line resistance, small compounding and superior welding tension. The specific contents of the present invention are as follows.

The present invention provides a glass powder, which is a glass powder comprising vanadium-tellurium-silver of formula (I):

$$V_a\text{—}Te_b\text{—}Ag_d M_c\text{-}N_e, \tag{I}$$

wherein 0<a, b, c or d<1, the sum of a, b, c or d is 1, $0.1 \le a \le 0.3$, $0.3 \le b \le 0.5$, $0.01 \le c \le 0.03$, $0.3 \le d \le 0.5$, M is one or more elements, and e is a natural number for balancing a charge of the glass powder.

In some embodiments of the present invention, the M element is selected from at least one of boron element, aluminum element, gallium element, silicon element, germanium element, tin element, phosphorus element, niobium element, titanium element, molybdenum element, tungsten element, chromium element, alkali metal elements, and alkaline earth metal elements.

In some embodiments of the present invention, the N element is selected from at least one of oxygen element, halogen element, carbonate and nitrate.

In some embodiments of the present invention, the glass powder has a softening temperature of 230-330° C. and a median particle size of 1-2 μm.

The present invention also provides a silver paste comprising the glass powder described above, which is prepared by mixing 80-95 parts by mass of a silver powder, 5-13 parts by mass of an organic vehicle and 2-4 parts by mass of the glass powder.

In some embodiments of the present invention, the silver powder has a median particle size $D_{50}$ of 50-500 nm.

In some embodiments of the present invention, the silver powder has a specific surface area of 3-10 $m^2/g$, a burnout rate of 0.2%-0.4% upon ablating at 540° C. for 30 min, and a tapped density of 6-8 g/mL.

In some embodiments of the present invention, the organic vehicle is at least one of a thixotropic agent, a thickener, a flexibilizer, a surfactant, an antioxidant, a binder, a dispersant and a solvent.

The solvent is selected from solvents with low saturated vapor pressure at the same temperature, which may be at least one of diethylene glycol dibutyl ether, texanol and ethylene glycol diacetate.

In some embodiments of the present invention, the silver paste comprising the glass powder has a welding tension of 2-4.3 N when serving as a front busbar, has a sintering temperature of 230-400° C., and is used for preparing a front electrode of a tunnel oxide passivated contact solar cell.

The present invention also provides a method for preparing a glass powder, which comprises:

step 1: weighing all components of the glass powder according to the ratio, and mixing the components well to obtain a mixture;

step 2: putting the mixture obtained in the step 1 into a ball mill for grinding for 4-6 h, mixing the mixture well, adding the ground mixture to a dried corundum crucible, and putting the corundum crucible into a resistance furnace at 1000-1400° C. for melting for 50-60 min;

step 3: taking out the corundum crucible in the step 2 from the resistance furnace, pouring the molten mixture into cold water for water quenching, and finally drying the water-quenched mixture to obtain a solid mixture; and step 4: putting the solid mixture obtained in the step 3 into a jet mill for grinding, with a working air pressure of 0.3-0.5 MPa and a rotating speed of a classifier of 400-600 r/min in the jet mill, and after grinding, putting the solid mixture into a drying oven for drying to obtain the glass powder.

a. Compared with the Prior Art, the Present Invention has the Following Beneficial Effects.

The glass powder disclosed in the present invention is a glass powder comprising vanadium-tellurium-silver, which has a strong network structure strength, and has a softening temperature of 230-330° C., so that when the glass powder is applied to the silver paste, the requirement that the silver paste is sintered at the temperature of 230-400° C. can be met, and a firm three-dimensional network structure can be formed in the glass system after the silver paste is sintered; when the glass powder is applied to the busbar paste, the welding tension of a front silver electrode can be improved; and when the glass powder is applied to finger grid paste for overprinting, the contact resistance between the silver and aluminum and the line resistance of the silver electrode can be reduced.

The glass powder of the present invention also comprises metal elements such as boron element, aluminum element, gallium element, silicon element, germanium element, tin element, phosphorus element, niobium element, titanium element, molybdenum element, tungsten element, chromium element, alkali metal elements and alkaline earth metal elements, and the addition of these metal elements can enable the network structure of the glass powder to be more compact and complete and ensure the stability of the glass powder.

The nano silver powder selected for the silver paste comprising the glass powder is uniform in particle size, narrow in particle size distribution range, good in dispersibility and excellent in conductivity. The nano silver powder has a median particle size $D_{50}$ of 50-500 nm, a specific surface area of 3-10 $m^2$/g, a burnout rate of 0.2%-0.4% upon ablating at 540° C. for 30 min, and a tapped density of 6-8 g/mL, so that when the nano silver powder is applied to the preparation of a low-temperature sintered silver paste, the silver paste has better fluidity and less damage to a silicon wafer when sintered at a temperature of 230-400° C., and has a welding tension of 2-4.3 N when serving as a front busbar.

DETAILED DESCRIPTION

Figure 1:
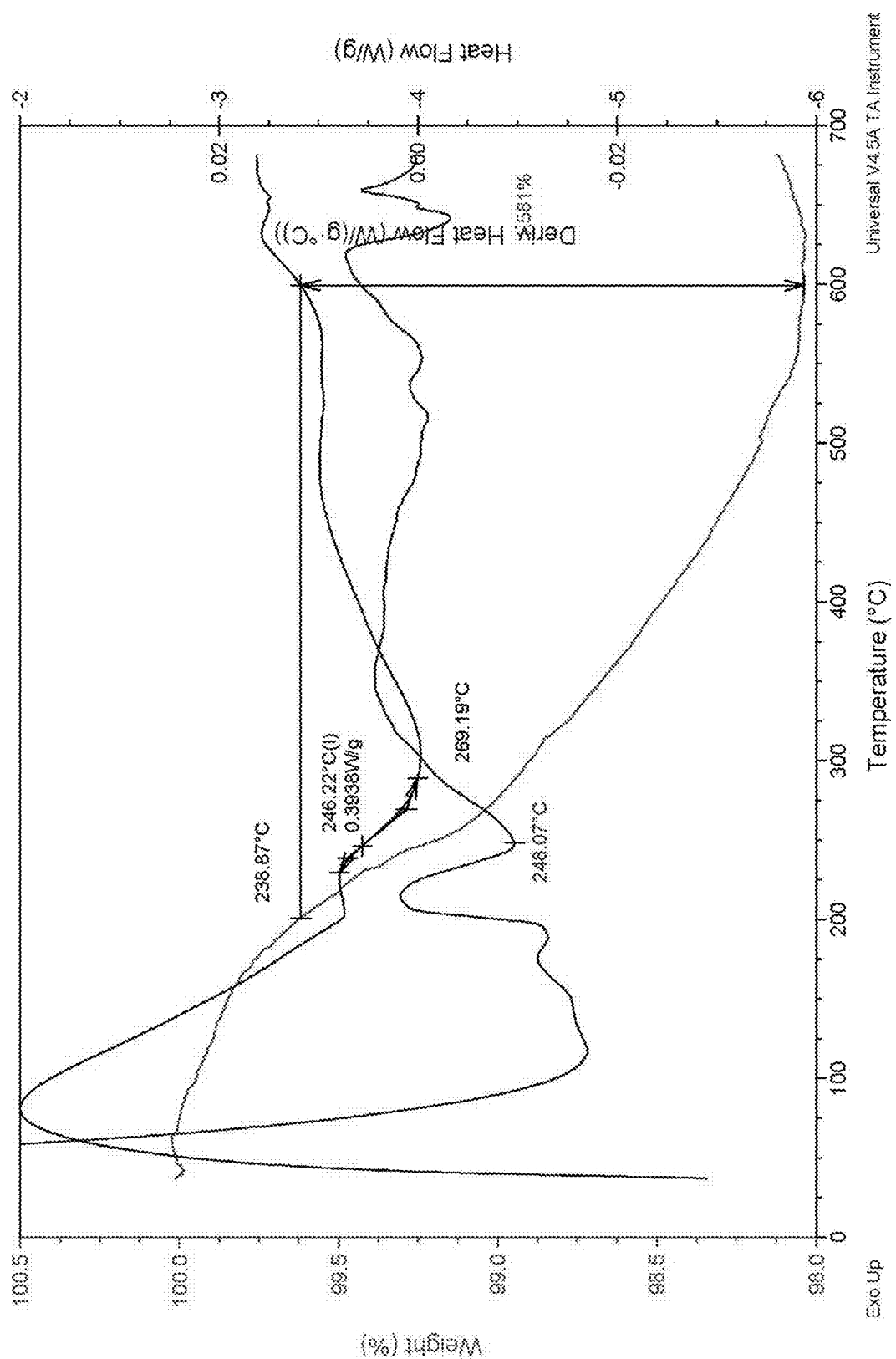
FIG. 1 is a DSC diagram of the glass powder prepared in Examples 1 and 4 according to the present invention.

In order to solve the above problems, the present invention provides a glass powder, a preparation method therefor and a silver paste comprising the glass powder, wherein the glass powder has a low softening point, so that the silver paste comprising the glass powder is highly active in a low-temperature environment, and has a high tension when being printed to form a front electrode. The specific contents of the present invention are as follows.

The present invention provides a glass powder having a softening temperature of 230-330° C., and a low-temperature sintered silver paste is prepared by mixing 2-4 parts by mass of the glass powder, 80-95 parts by mass of a specific nano silver powder and 5-13 parts by mass of an organic vehicle with lower saturated vapor pressure. The low-temperature sintered silver paste can be screen printed on the front side of a tunnel oxide passivated contact (TOPCon) solar cell to form a front finger grid or a front busbar; when serving as the front finger grid, the silver paste is overprinted on an aluminum paste to form the front finger grid only having a width of 25-40 μm, so that the finger grid has low line resistance, good silver-aluminum adhesion, weak silver-aluminum interaction, and low silver-aluminum contact resistance; and when serving as the busbar, the silver paste is highly active, has superior welding tension of 2-4.3 N, and can be sintered at a temperature of 230-400° C. with less damage to the silicon wafer. It has been reported in the literature that the highest temperature that a P-N junction of a heterojunction solar cell can withstand is 230° C., thus the low-temperature sintered silver paste can be used in the heterojunction solar cell to produce good photoelectric conversion efficiency on the premise of not damaging the P-N junction of the heterojunction solar cell.

Glass Powder

The glass powder of the present invention is a glass powder comprising vanadium-tellurium-silver of formula (I):

$$V_a\text{—}Te_b\text{—}Ag_c\text{M}_c\text{-N}_e, \qquad (I),$$

wherein 0<a, b, c or d<1, the sum of a, b, c or d is 1, 0.1≤a≤0.3, 0.3≤b≤0.5, 0.01≤c≤0.03, 0.3≤d≤0.5, M is one or more elements, and e is a natural number for balancing a charge of the glass powder. The glass system of the glass powder comprising vanadium-tellurium-silver has a strong network structure strength, so that when the glass system is applied to the silver paste, the silver paste can have superior welding tension. The M element is selected from at least one of boron element, aluminum element, gallium element, silicon element, germanium element, tin element, phosphorus element, niobium element, titanium element, molybdenum element, tungsten element, chromium element, alkali metal elements and alkaline earth metal elements, and the addition of these metal elements can enable the network structure of the glass powder to be more compact and complete and ensure the stability of the glass powder. The N element is selected from at least one of oxygen element, halogen elements, carbonate and nitrate. The glass powder of the system has a softening temperature of 230-330° C. and a median particle size of 1-2 μm, when the median particle size of the glass powder is less than 1 the activity of the glass powder is so high that the solar cell silicon wafer is easily damaged in the sintering process, and when the median particle size of the glass powder is more than 2 the specific surface area of the glass powder is relatively smaller with the greater particle size, so that the softening temperature of the glass powder is increased, and the sintering temperature of a silver paste prepared from the glass powder will be too high.

Silver Powder

The silver powder used in the present invention has a median particle size $D_{50}$ of 50-500 nm. The silver powder used in the present invention is uniform in particle size, narrow in particle size distribution range, good in dispersibility and excellent in conductivity. The silver powder of the present invention has a specific surface area of 3-10 m²/g. The fact shows that with the increase of the specific surface area of the silver powder, the sintering temperature of the silver paste prepared from the silver powder decreases. Therefore, in order to reduce the sintering temperature of the silver paste, it is more direct and effective to increase the specific surface area of the silver powder. However, with the increase of the specific surface area of the silver powder, the silver powder is more likely to agglomerate, and meanwhile, due to the higher oxidation activity of the silver powder with a larger specific surface area, the silver paste prepared from the silver powder is easy to oxidize with oxygen in the air in the sintering process, thereby affecting the quality of the silver powder, and when the specific surface area of the silver powder is increased to 10 m²/g or more, the silver powder will have severe agglomeration and oxidation reaction. The silver powder of the present invention has a burnout rate of 0.2%-0.4% upon ablating for 30 min at 540° C. Theoretically, the smaller the burnout rate of the silver powder, the higher the sintering activity of the silver powder, and when serving as a conductive metal powder of the silver paste, the silver powder will result in a decrease in the sintering temperature of the silver paste. The silver powder has a tapped density of 6-8 g/mL. The applicant found through experiments that the larger the tapped density of the silver powder, the larger the welding tension of the silver paste prepared from the silver powder when serving as a front busbar, and the tapped density of the silver powder is most suitable to be 6-8 g/mL according to the properties of the present invention.

Organic Vehicle

The organic vehicle of the present invention is at least one of a thixotropic agent, a thickener, a flexibilizer, a surfactant, an antioxidant, a binder, a dispersant and a solvent. The addition of the thixotropic agent, the thickener, the flexibilizer, the surfactant and the antioxidant confers better plastic property and rheological property on the prepared silver paste, wherein the solvent is selected from solvents with low saturated vapor pressure at the same temperature, which may be at least one of diethylene glycol dibutyl ether, texanol and ethylene glycol diacetate, preferably, the solvent is solvents with lower saturated vapor pressure that have better thermal decomposition capability, and if the solvent has too high saturated vapor pressure, the organic solvent cannot be completely volatilized and remains in the prepared silver paste in the low-temperature sintering process, so that the line resistance of the silver paste is increased, and the photoelectric conversion efficiency of the silver paste is further influenced.

The silver paste comprising the glass powder prepared in the present invention has a welding tension of 2-4.3 N when serving as a front busbar, has a sintering temperature of 230-400° C., and is used for preparing a front electrode of a tunnel oxide passivated contact solar cell.

The technical schemes in the embodiments of the present invention will be clearly and completely described below, for a better understanding of the advantages and features of the present invention by those skilled in the art, and for a more the clearly defined protection scope of the present invention. The described embodiments are only some, but not all, embodiments of the invention. Based on the embodiments of the present invention, all other embodiments obtained by those of ordinary skill in the art without making any creative effort will fall within the protection scope of the present invention. Unless otherwise specified, all the raw materials in the present invention are commercially available.

Example 1

Provided is a glass powder, which is a glass powder comprising vanadium-tellurium-silver of formula (I):

$$V_a\text{—}Te_b\text{—}Ag_d\text{M}_c\text{-N}_e, \tag{I}$$

wherein a=0.2, b=0.4, c=0.02, d=0.38, and e is a natural number for balancing a charge of the glass powder;

the M element is boron element, aluminum element, gallium element, silicon element and sodium element; and the N element is oxygen element.

According to the above formula, the inorganic glass powder of the present invention is prepared as follows:

step 1: weighing all components of the glass powder according to the ratio, and mixing the components well to obtain a mixture;

step 2: putting the mixture obtained in the step 1 into a ball mill for grinding for 5 h, mixing the mixture well, adding the ground mixture to a dried corundum crucible, and putting the corundum crucible into a resistance furnace at 1200° C. for melting for 55 min;

step 3: taking out the corundum crucible in the step 2 from the resistance furnace, pouring the molten mixture into cold water for water quenching, and finally drying the water-quenched mixture to obtain a solid mixture; and step 4: putting the solid mixture obtained in the step 3 into a jet mill for grinding, with a working air pressure of 0.4 MPa and a rotating speed of a classifier of 500 r/min in the jet mill, and after grinding, putting the solid mixture into a drying oven for drying to obtain the glass powder, which has a softening temperature of 248.07° C. as shown in FIG. 1 and a median particle size of 1 μm.

The prepared glass powder is used for preparing a low-temperature sintered silver paste which is prepared by mixing 85 kg of silver powder, 12 kg of organic vehicle and 3 kg of the prepared glass powder.

Figure 9:
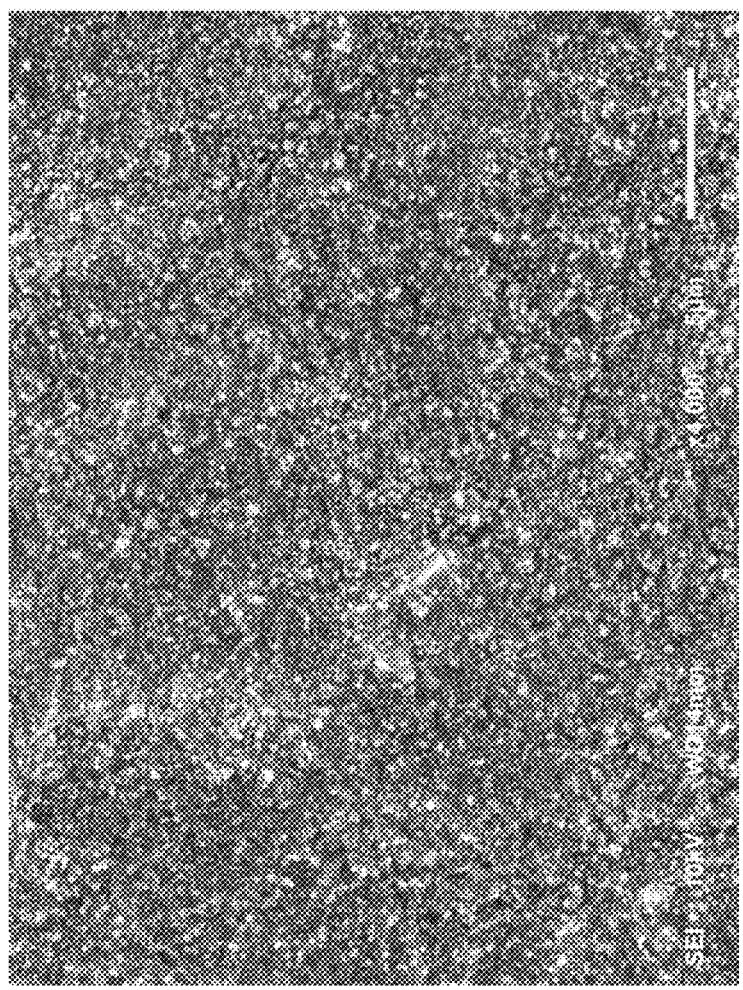
FIG. 9 is an SEM micrograph of the silver powder selected for Example 1 according to the present invention.

The selected silver powder has a median particle size $D_{50}$ of 200-300 nm, and FIG. 9 is an SEM micrograph of a nano silver powder selected for Example 1, from which it can be seen that the nano silver powder has uniform particle size distribution.

The selected silver powder has a specific surface area of 6.5 m²/g, a burnout rate of 0.3% upon ablating at 540° C. for 30 min, and a tapped density of 7 g/mL.

The organic vehicle comprises a thixotropic agent, a thickener, a flexibilizer, a surfactant, an antioxidant, a binder and a dispersant which are commonly used in the conductive paste for the solar cell, and the type and amount of the organic vehicle to be added can be adjusted according to the viscosity, conductivity and sintering properties of the paste.

All solvents of the organic vehicle are a mixture of diethylene glycol dibutyl ether and texanol.

Figure 4:
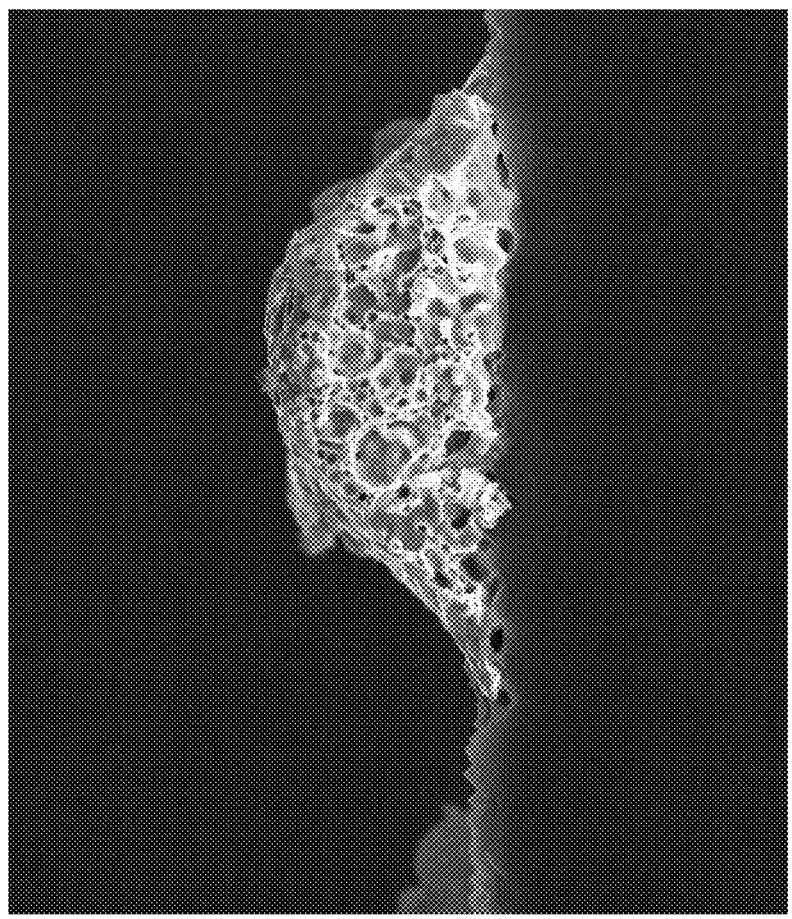
FIG. 4 is an SEM electron micrograph of the silver paste prepared in Example 1 according to the present invention.

The selected silver paste comprising the glass powder has a welding tension of 3.5 N when serving as a front busbar, has a sintering temperature of 300° C., and is used for preparing a front electrode of a tunnel oxide passivated contact solar cell. The morphology of the front electrode of the solar cell prepared in this example is observed by a scanning electron microscope, and the results are shown in FIG. 4, from which it can be seen that the silver paste has a high sintering density.

Example 2

Provided is a glass powder, which is a glass powder comprising vanadium-tellurium-silver of formula (I):

$$V_a\text{—}Te_b\text{—}Ag_d\text{M}_c\text{-N}_e, \tag{I}$$

wherein a=0.3, b=0.3, c=0.01, d=0.39, and e is a natural number for balancing a charge of the glass powder;

the M element is gallium element, silicon element, germanium element and potassium element; and the N element is a halogen element.

Figure 2:
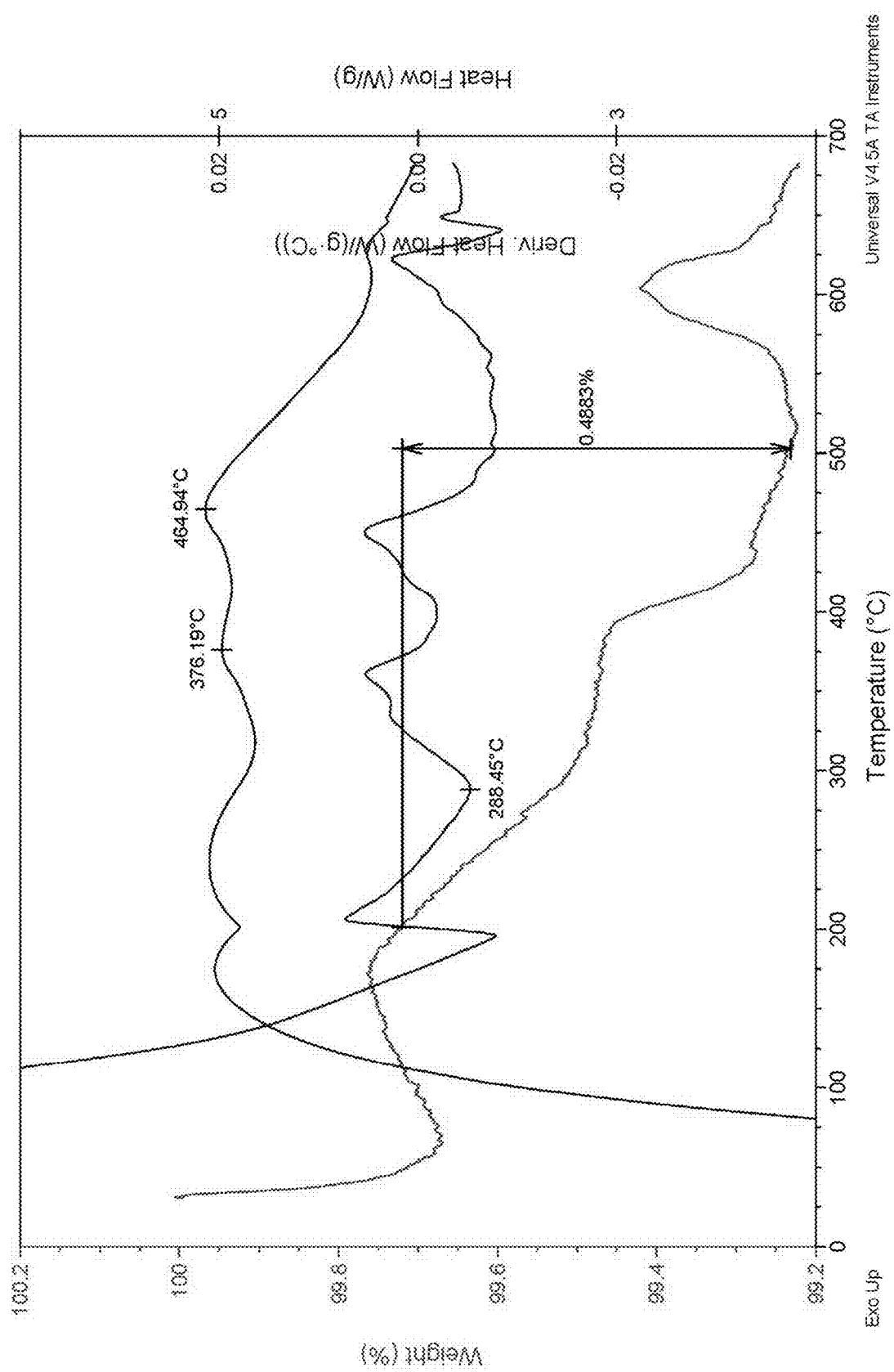
FIG. 2 is a DSC diagram of the glass powder prepared in Example 2 according to the present invention.

According to the above formula, the inorganic glass powder of the present invention is prepared as follows:

step 1: weighing all components of the glass powder according to the ratio, and mixing the components well to obtain a mixture;

step 2: putting the mixture obtained in the step 1 into a ball mill for grinding for 5 h, mixing the mixture well, adding the ground mixture to a dried corundum crucible, and putting the corundum crucible into a resistance furnace at 1200° C. for melting for 55 min;

step 3: taking out the corundum crucible in the step 2 from the resistance furnace, pouring the molten mixture into cold water for water quenching, and finally drying the water-quenched mixture to obtain a solid mixture; and step 4: putting the solid mixture obtained in the step 3 into a jet mill for grinding, with a working air pressure of 0.4 MPa and a rotating speed of a classifier of 500 r/min in the jet mill, and after grinding, putting the solid mixture into a drying oven for drying to obtain the glass powder, which has a softening temperature of 288.45° C. as shown in FIG. 2 and a median particle size of 1.8 μm.

The prepared glass powder is used for preparing a low-temperature sintered silver paste which is prepared by mixing 85 kg of silver powder, 13 kg of organic vehicle and 2 kg of the prepared glass powder.

Figure 10:
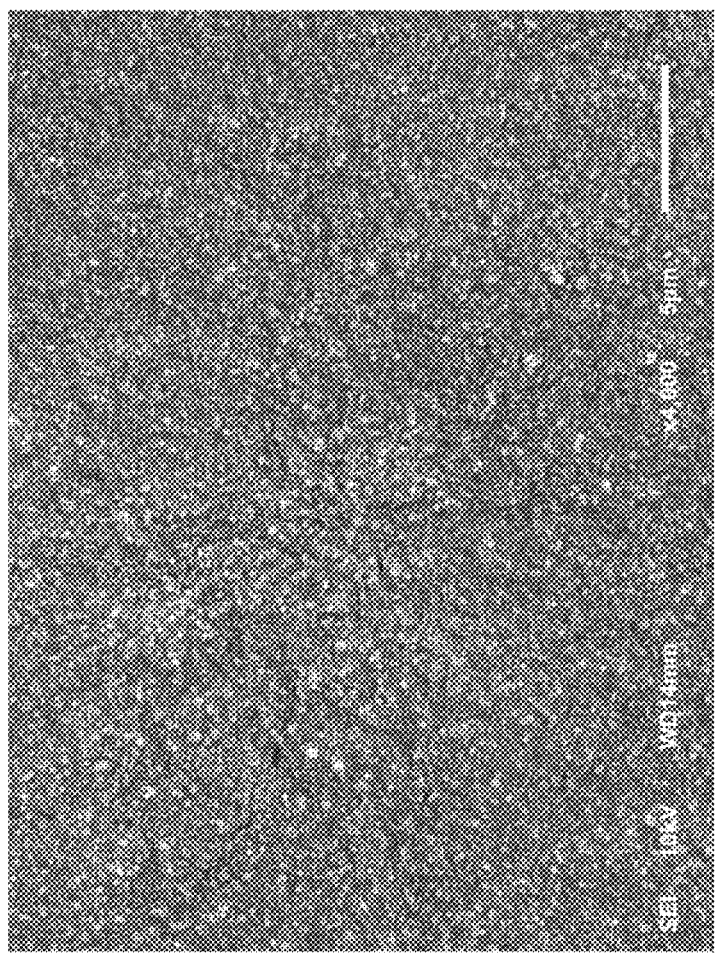
FIG. 10 is an SEM micrograph of the silver powder selected for Example 2 according to the present invention.

The selected silver powder has a median particle size $D_{50}$ of 50-100 nm, and FIG. 10 is an SEM micrograph of a nano silver powder selected for Example 2, from which it can be seen that the nano silver powder has uniform particle size distribution.

The selected silver powder has a specific surface area of 3 m$^2$/g, a burnout rate of 0.2% upon ablating at 540° C. for 30 min, and a tapped density of 6 g/mL.

The organic vehicle comprises a thixotropic agent, a thickener, a flexibilizer, a surfactant, an antioxidant, a binder and a dispersant which are commonly used in the conductive paste for the solar cell, and the type and amount of the organic vehicle to be added can be adjusted according to the viscosity, conductivity and sintering properties of the paste.

All solvents of the organic vehicle are a mixture of diethylene glycol dibutyl ether and ethylene glycol diacetate.

Figure 5:
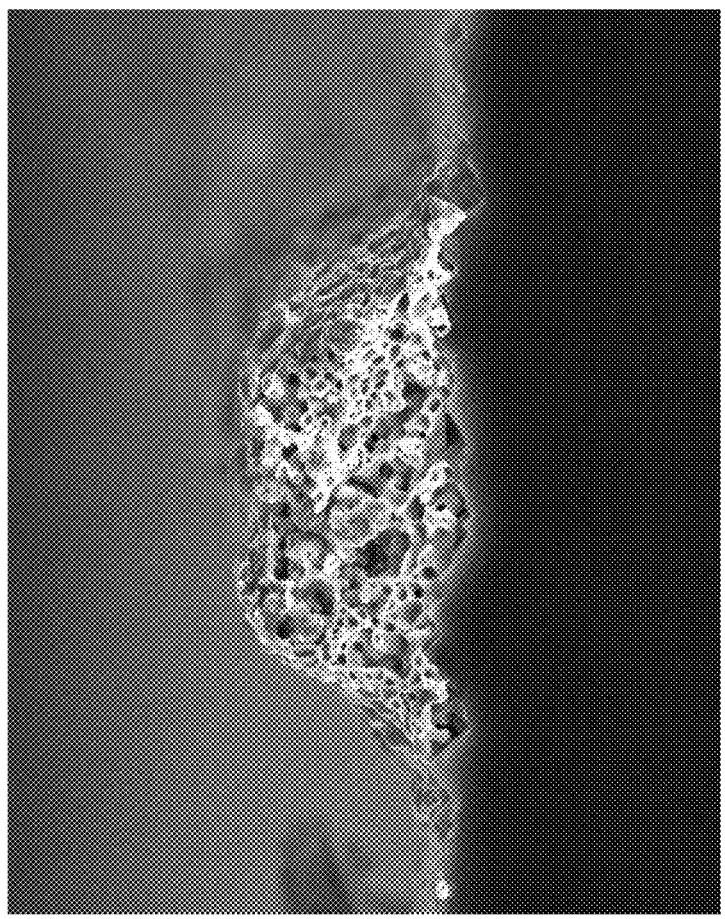
FIG. 5 is an SEM electron micrograph of the silver paste prepared in Example 2 according to the present invention.

The selected silver paste comprising the glass powder has a welding tension of 2.6 N when serving as a front busbar, has a sintering temperature of 200° C., and is used for preparing a front electrode of a tunnel oxide passivated contact solar cell. The morphology of the front electrode of the solar cell prepared in this example is observed by a scanning electron microscope, and the results are shown in FIG. 5, from which it can be seen that the silver paste has a high sintering density.

Example 3

Provided is a glass powder, which is a glass powder comprising vanadium-tellurium-silver of formula (I):

wherein a=0.1, b=0.4, c=0.03, d=0.47, and e is a natural number for balancing a charge of the glass powder;

the M element is silicon element, germanium element, tin element, phosphorus element, magnesium element, calcium element and potassium element; and the N element is carbonate.

Figure 3:
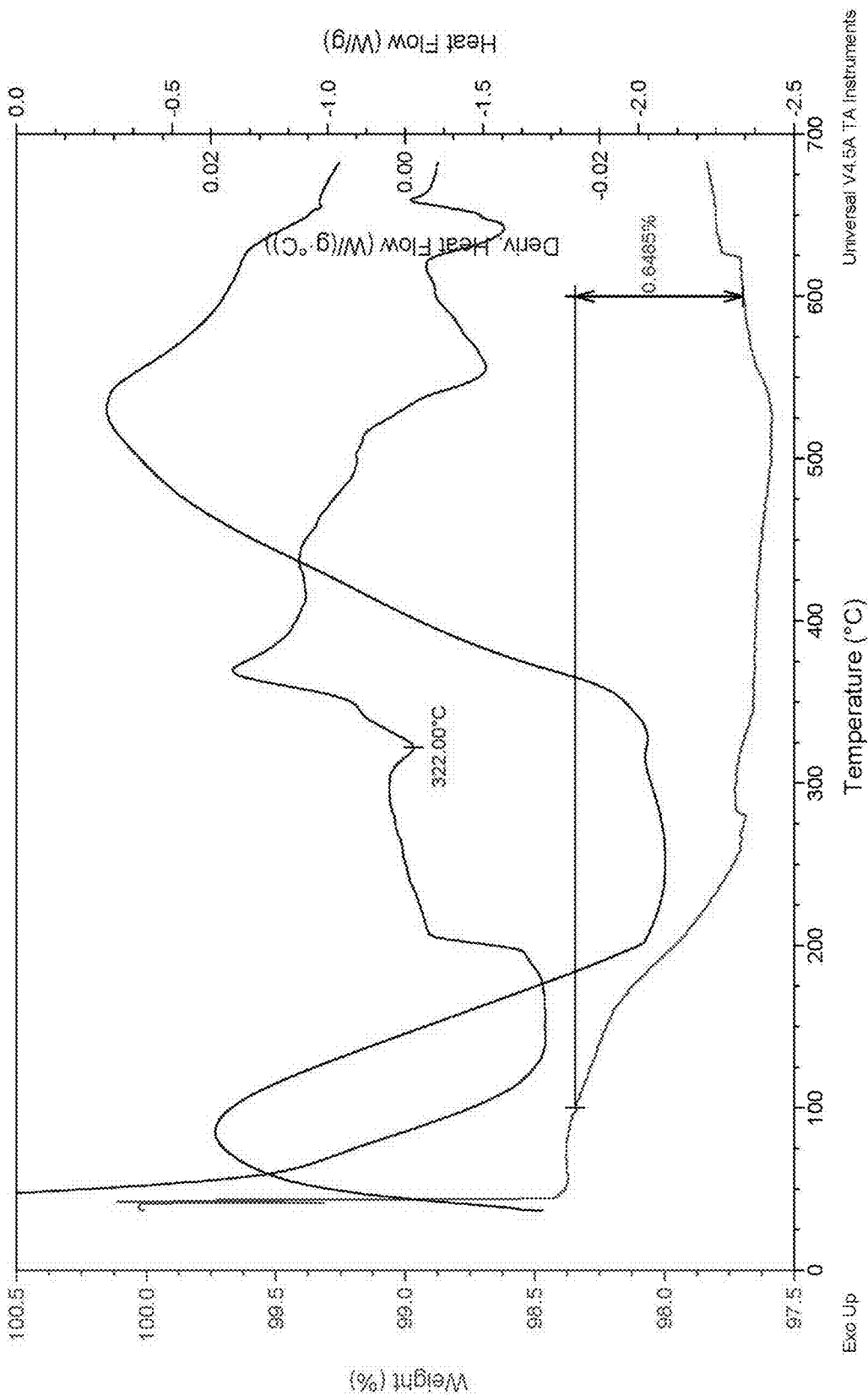
FIG. 3 is a DSC diagram of the glass powder prepared in Examples 3 and 5 according to the present invention.

According to the above formula, the inorganic glass powder of the present invention is prepared as follows:

step 1: weighing all components of the glass powder according to the ratio, and mixing the components well to obtain a mixture;

step 2: putting the mixture obtained in the step 1 into a ball mill for grinding for 5 h, mixing the mixture well, adding the ground mixture to a dried corundum crucible, and putting the corundum crucible into a resistance furnace at 1200° C. for melting for 55 min;

step 3: taking out the corundum crucible in the step 2 from the resistance furnace, pouring the molten mixture into cold water for water quenching, and finally drying the water-quenched mixture to obtain a solid mixture; and step 4: putting the solid mixture obtained in the step 3 into a jet mill for grinding, with a working air pressure of 0.4 MPa and a rotating speed of a classifier of 500 r/min in the jet mill, and after grinding, putting the solid mixture into a drying oven for drying to obtain the glass powder, which has a softening temperature of 322.00° C. as shown in FIG. 3 and a median particle size of 1.2 μm.

The prepared glass powder is used for preparing a low-temperature sintered silver paste which is prepared by mixing 83 kg of silver powder, 13 kg of organic vehicle and 4 kg of the prepared glass powder.

Figure 11:
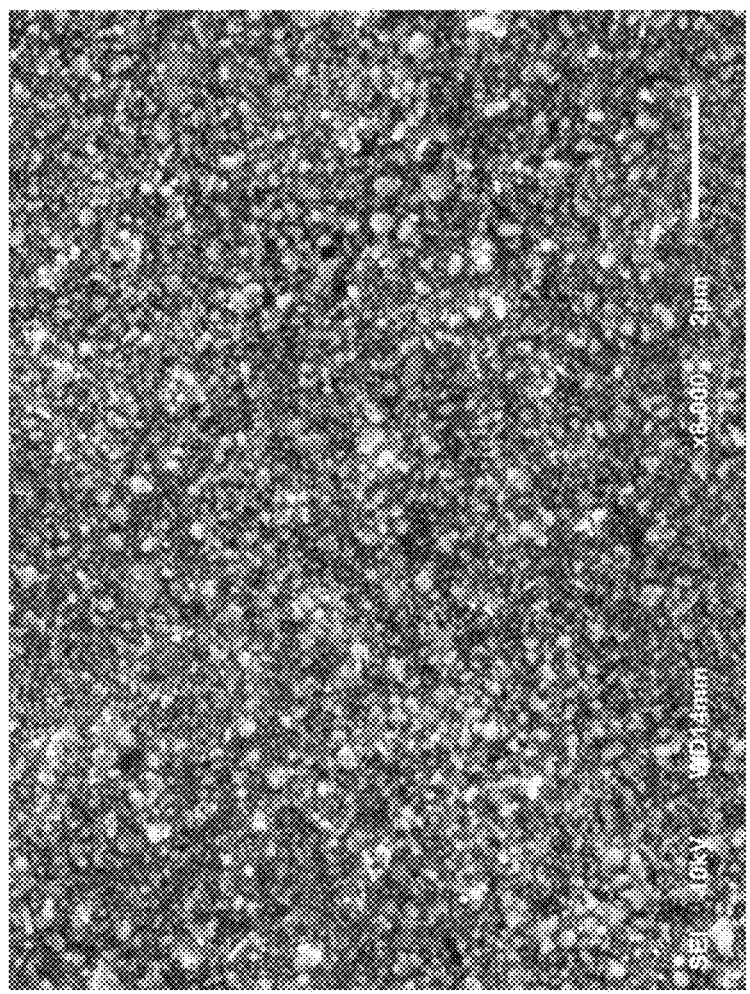
FIG. 11 is an SEM micrograph of the silver powder selected for Example 3 according to the present invention.

The selected silver powder has a median particle size $D_{50}$ of 100-200 nm, and FIG. 11 is an SEM micrograph of a nano silver powder selected for Example 3, from which it can be seen that the nano silver powder has uniform particle size distribution.

The selected silver powder has a specific surface area of 10$^2$/g, a burnout rate of 0.2% upon ablating at 540° C. for 30 min, and a tapped density of 6.5 g/mL.

The organic vehicle comprises a thixotropic agent, a thickener, a flexibilizer, a surfactant, an antioxidant, a binder and a dispersant which are commonly used in the conductive paste for the solar cell, and the type and amount of the organic vehicle to be added can be adjusted according to the viscosity, conductivity and sintering properties of the paste.

All solvents of the organic vehicle are a mixture of texanol and ethylene glycol diacetate.

Figure 6:
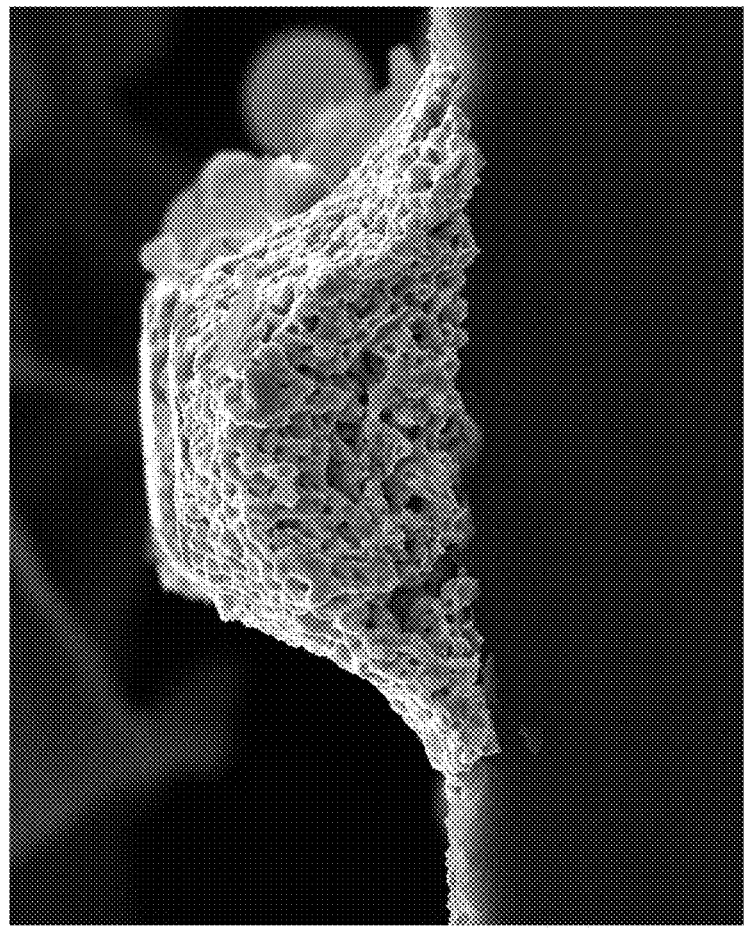
FIG. 6 is an SEM electron micrograph of the silver paste prepared in Example 3 according to the present invention.

The selected silver paste comprising the glass powder has a welding tension of 3.2 N when serving as a front busbar, has a sintering temperature of 280° C., and is used for preparing a front electrode of a tunnel oxide passivated contact solar cell. The morphology of the front electrode of the solar cell prepared in this example is observed by a scanning electron microscope, and the results are shown in FIG. 6, from which it can be seen that the silver paste has a high sintering density.

Example 4

Provided is a glass powder, which is a glass powder comprising vanadium-tellurium-silver of formula (I):

wherein a=0.2, b=0.4, c=0.02, d=0.38, and e is a natural number for balancing a charge of the glass powder;

the M element is boron element, aluminum element, gallium element, silicon element and sodium element; and the N element is oxygen element.

According to the above formula, the inorganic glass powder of the present invention is prepared as follows:

step 1: weighing all components of the glass powder according to the ratio, and mixing the components well to obtain a mixture;

step 2: putting the mixture obtained in the step 1 into a ball mill for grinding for 5 h, mixing the mixture well, adding the ground mixture to a dried corundum crucible, and putting the corundum crucible into a resistance furnace at 1200° C. for melting for 55 min;

step 3: taking out the corundum crucible in the step 2 from the resistance furnace, pouring the molten mixture into cold water for water quenching, and finally drying the water-quenched mixture to obtain a solid mixture; and step 4: putting the solid mixture obtained in the step 3 into a jet mill for grinding, with a working air pressure of 0.4 MPa and a rotating speed of a classifier of 500 r/min in the jet mill, and after grinding, putting the solid mixture into a drying oven for drying to obtain the glass powder, which has a softening temperature of 248.07° C. as shown in FIG. 1 and a median particle size of 1.5 μm.

The prepared glass powder is used for preparing a low-temperature sintered silver paste which is prepared by mixing 90 kg of silver powder, 6 kg of organic vehicle and 4 kg of the prepared glass powder.

Figure 12:
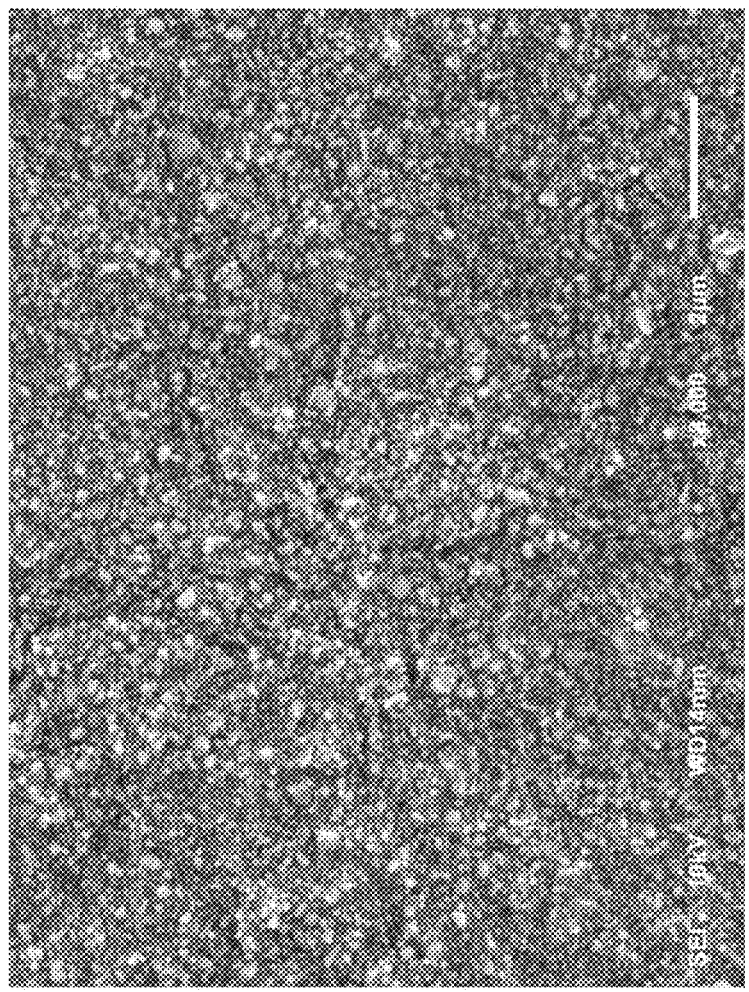
FIG. 12 is an SEM micrograph of the silver powder selected for Example 4 according to the present invention.

The selected silver powder has a median particle size $D_{50}$ of 400-500 nm, and FIG. 12 is an SEM micrograph of a nano silver powder selected for Example 4, from which it can be seen that the nano silver powder has uniform particle size distribution.

The selected silver powder has a specific surface area of 4 $m^2$/g, a burnout rate of 0.2% upon ablating at 540° C. for 30 min, and a tapped density of 8 g/mL.

The organic vehicle comprises a thixotropic agent, a thickener, a flexibilizer, a surfactant, an antioxidant, a binder and a dispersant which are commonly used in the conductive paste for the solar cell, and the type and amount of the organic vehicle to be added can be adjusted according to the viscosity, conductivity and sintering properties of the paste.

All solvents of the organic vehicle are texanol.

Figure 7:
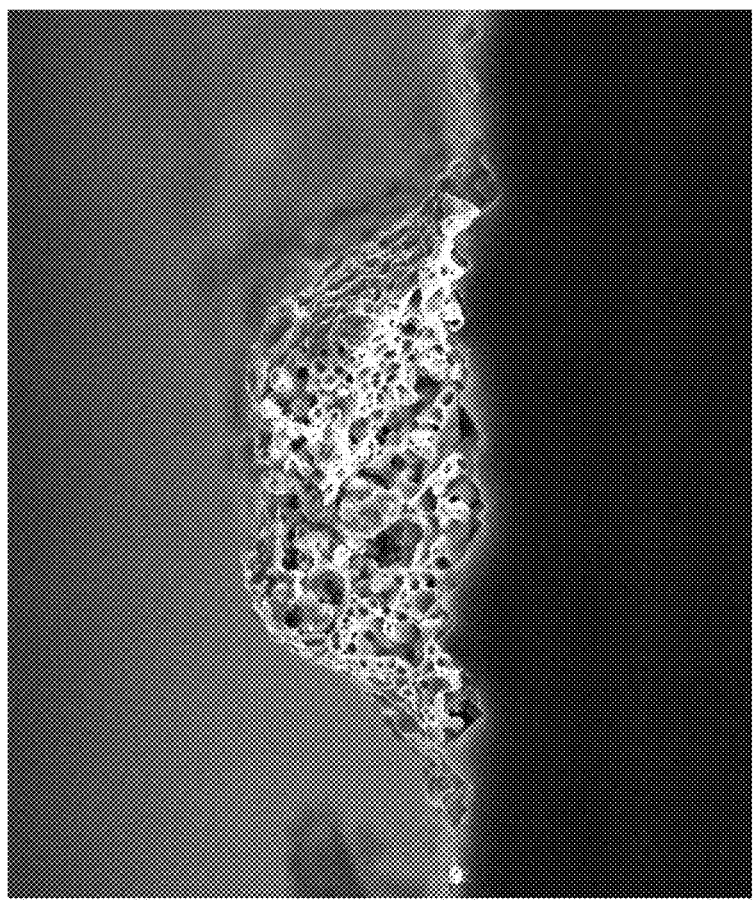
FIG. 7 is an SEM electron micrograph of the silver paste prepared in Example 4 according to the present invention.

The selected silver paste comprising the glass powder has a welding tension of 4.3 N when serving as a front busbar, has a sintering temperature of 350° C., and is used for preparing a front electrode of a tunnel oxide passivated contact solar cell. The morphology of the front electrode of the solar cell prepared in this example is observed by a scanning electron microscope, and the results are shown in FIG. 7, from which it can be seen that the silver paste has a high sintering density.

Example 5

Provided is a glass powder, which is a glass powder comprising vanadium-tellurium-silver of formula (I):

$V_a$—$Te_b$—$Ag_d$-$M_c$-$N_e$, (I), wherein a=0.1, b=0.4, c=0.03, d=0.47, and e is a natural number for balancing a charge of the glass powder;

the M element is silicon element, germanium element, tin element, phosphorus element, magnesium element, calcium element and potassium element; and the N element is carbonate.

According to the above formula, the inorganic glass powder of the present invention is prepared as follows:

step 1: weighing all components of the glass powder according to the ratio, and mixing the components well to obtain a mixture;

step 2: putting the mixture obtained in the step 1 into a ball mill for grinding for 5 h, mixing the mixture well, adding the ground mixture to a dried corundum crucible, and putting the corundum crucible into a resistance furnace at 1200° C. for melting for 55 min;

step 3: taking out the corundum crucible in the step 2 from the resistance furnace, pouring the molten mixture into cold water for water quenching, and finally drying the water-quenched mixture to obtain a solid mixture; and step 4: putting the solid mixture obtained in the step 3 into a jet mill for grinding, with a working air pressure of 0.4 MPa and a rotating speed of a classifier of 500 r/min in the jet mill, and after grinding, putting the solid mixture into a drying oven for drying to obtain the glass powder, which has a softening temperature of 322.00° C. as shown in FIG. 3 and a median particle size of 1.75 μm.

The prepared glass powder is used for preparing a low-temperature sintered silver paste which is prepared by mixing 90 kg of silver powder, 6 kg of organic vehicle and 4 kg of the prepared glass powder.

Figure 13:
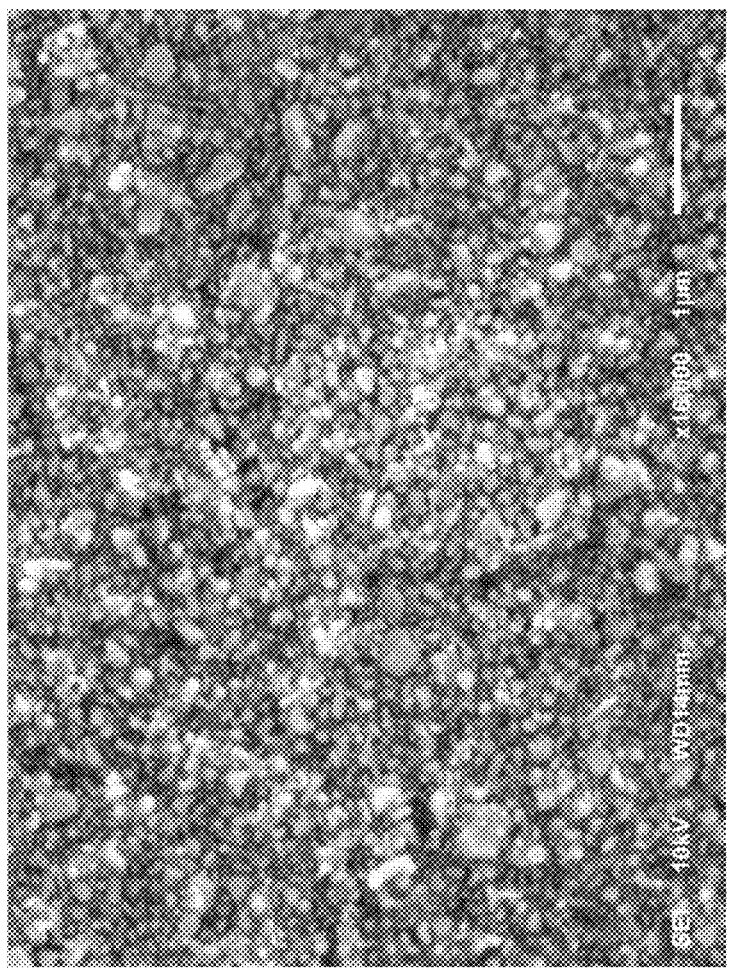
FIG. 13 is an SEM micrograph of the silver powder selected for Example 5 according to the present invention.

The selected silver powder has a median particle size $D_{50}$ of 100-200 nm, and FIG. 13 is an SEM micrograph of a nano silver powder selected for Example 5, from which it can be seen that the nano silver powder has uniform particle size distribution.

The selected silver powder has a specific surface area of 8 $m^2$/g, a burnout rate of 0.2% upon ablating at 540° C. for 30 min, and a tapped density of 7.5 g/mL.

The organic vehicle comprises a thixotropic agent, a thickener, a flexibilizer, a surfactant, an antioxidant, a binder and a dispersant which are commonly used in the conductive paste for the solar cell, and the type and amount of the organic vehicle to be added can be adjusted according to the viscosity, conductivity and sintering properties of the paste.

All solvents of the organic vehicle are diethylene glycol dibutyl ether.

Figure 8:
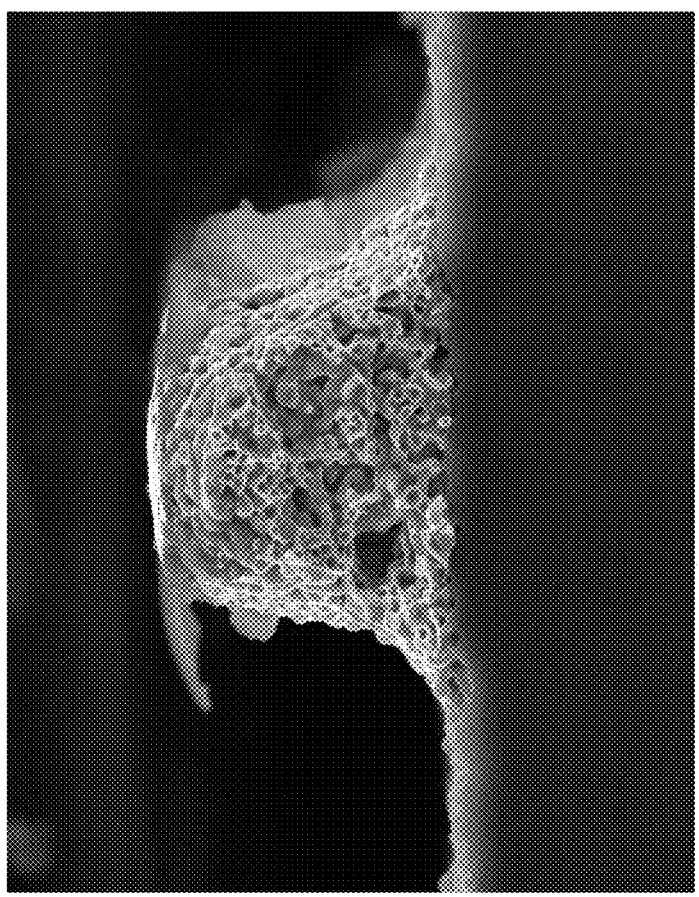
FIG. 8 is an SEM electron micrograph of the silver paste prepared in Example 5 according to the present invention.

The selected silver paste comprising the glass powder has a welding tension of 2.7 N when serving as a front busbar, has a sintering temperature of 275° C., and is used for preparing a front electrode of a tunnel oxide passivated contact solar cell. The morphology of the front electrode of the solar cell prepared in this example is observed by a scanning electron microscope, and the results are shown in FIG. 8, from which it can be seen that the silver paste has a high sintering density.

Experimental Example

The silver paste prepared in the present invention can be used for preparing the front electrodes of a tunnel oxide passivated contact solar cell and a heterojunction solar cell. In this experimental example, the low-temperature sintered silver pastes prepared in Examples 1-5 are each screen printed on the front side of the tunnel oxide passivated contact solar cell, and the conventional silver paste is printed on the front electrode of the tunnel oxide passivated contact solar cell, which is taken as a comparative example, and then the sintering temperature of the silver pastes in these examples is recorded, and the cells obtained are detected for efficiency by I-V tests. The test result is shown in Table 1.

TABLE 1

| | Comparison of performances | | | | |
|---|---|---|---|---|---|
| | Sintering temperature (° C.) | Voltage of open circuit (Voc) (mV) | Tension (N) | Fill factor (FF) (%) | Photoelectric conversion efficiency (PCE) (%) |
| Comparative Example | 630 | 675 | 2.0 | 81.52 | 22.15 |
| Example 1 | 300 | 687 | 3.5 | 81.53 | 22.35 |
| Example 2 | 200 | 684 | 2.6 | 82.01 | 22.31 |
| Example 3 | 280 | 685 | 3.2 | 81.56 | 22.37 |
| Example 4 | 350 | 689 | 4.3 | 81.63 | 22.75 |
| Example 5 | 275 | 683 | 2.7 | 81.67 | 22.65 |

As can be seen from Table 1, the low-temperature sintered silver paste which is printed on the front electrode of the tunnel oxide passivated contact solar cell to form a front electrode has a low sintering temperature and less damage to the cell, the voltage of open circuit and the fill factor of the front electrode prepared from the low-temperature sintered silver paste of the present invention are higher than those of the front electrode prepared from the conventional silver paste on the market, and the photoelectric conversion efficiency of the front electrode prepared from the low-temperature sintered silver paste of the present invention is 0.16%-0.6% higher than that of the conventional silver paste, and the welding tension of the silver paste of the present invention is 0.6-2.3 N higher than that of the conventional silver paste.

Finally, it should be noted that the above descriptions are only preferred examples of the present invention and are not intended to limit the present invention, and any modifications, equivalents and improvements made within the spirit and principle of the present invention should be included in the protection scope of the present invention.

What is claimed is:

1. A glass powder having a vanadium-tellurium-silver of formula (I):

$$V_a\text{-}Te_b\text{-}Ag_d\text{-}M_c\text{-}N_e$$

wherein $0<a$, b, c or $d<1$, the sum of a, b, c and d is 1, $0.1 \leq a \leq 0.2$, $0.3 \leq b \leq 0.5$, $0.01 \leq c \leq 0.03$, $0.3 \leq d \leq 0.5$, M element is at least one selected from the group consisting of boron element, aluminum element, gallium element, silicon element, germanium element, tin element, phosphorus element, niobium element, titanium element, molybdenum element, tungsten element, chromium element, alkali metal elements, and alkaline earth metal elements, N is at least one selected from the group consisting of oxygen element, halogen elements, carbonate and nitrate, and e is an integer number for balancing a charge of the glass powder.

2. The glass powder according to claim 1, wherein the glass powder has a softening temperature of 230-330° C. and a median particle size of 1-2 μm.

3. A silver paste comprising the glass powder according to claim 1 prepared by mixing 80-95 parts by mass of a silver powder, 5-13 parts by mass of an organic vehicle and 2-4 parts by mass of the glass powder.

4. The silver paste according to claim 3, wherein the silver powder has a median particle size $D_{50}$ of 50-500 nm.

5. The silver paste according to claim 4, wherein the silver paste has a welding tension of 2-4.3 N when serving as a front busbar, has a sintering temperature of 230-400° C., and is used for preparing a front electrode of a tunnel oxide passivated contact solar cell.

6. The silver paste according to claim 3, wherein the silver powder has a specific surface area of 3-10 m²/g, a burnout rate of 0.2%-0.4% upon ablating at 540° C. for 30 min, and a tapped density of 6-8 g/mL.

7. The silver paste according to claim 3, wherein the organic vehicle is at least one of a thixotropic agent, a thickener, a flexibilizer, a binder, a surfactant, an antioxidant, a dispersant and a solvent.

8. A method for preparing the glass powder according to claim 1, comprising:
    step 1: weighing all components of the glass powder according to the ratio, and mixing the components well to obtain a mixture;
    step 2: putting the mixture obtained in the step 1 into a ball mill for grinding for 4-6 h, mixing the mixture well, adding the ground mixture to a dried corundum crucible, and putting the corundum crucible into a resistance furnace at 1000-1400° C. for melting for 50-60 min;
    step 3: taking out the corundum crucible in the step 2 from the resistance furnace, pouring the molten mixture into cold water for water quenching, and finally drying the water-quenched mixture to obtain a solid mixture; and
    step 4: putting the solid mixture obtained in the step 3 into a jet mill for grinding, with a working air pressure of 0.3-0.5 MPa and a rotating speed of a classifier of 400-600 r/min in the jet mill, and after grinding, putting the solid mixture into a drying oven for drying to obtain the glass powder.

\* \* \* \* \*